United States Patent
Tetelbaum et al.

(10) Patent No.: US 7,971,169 B1
(45) Date of Patent: Jun. 28, 2011

(54) SYSTEM AND METHOD FOR REDUCING THE GENERATION OF INCONSEQUENTIAL VIOLATIONS RESULTING FROM TIMING ANALYSES

(75) Inventors: Alexander Y. Tetelbaum, Hayward, CA (US); Sreejit Chakravarty, Mountain View, CA (US); Nicholas A. Callegari, Lompoc, CA (US)

(73) Assignee: LSI Corporation, Milpitas, CA (US)

( * ) Notice: Subject to any disclaimer, the term of this patent is extended or adjusted under 35 U.S.C. 154(b) by 384 days.

(21) Appl. No.: 12/190,784

(22) Filed: Aug. 13, 2008

(51) Int. Cl.
*G06F 17/50* (2006.01)
(52) U.S. Cl. .......................... 716/113; 716/108; 703/19
(58) Field of Classification Search .................. 716/108, 716/113; 703/19
See application file for complete search history.

(56) References Cited

U.S. PATENT DOCUMENTS

| | | | | |
|---|---|---|---|---|
| 5,452,239 A * | 9/1995 | Dai et al. | | 703/19 |
| 5,648,913 A * | 7/1997 | Bennett et al. | | 716/6 |
| 5,946,475 A * | 8/1999 | Burks et al. | | 716/6 |
| 6,499,129 B1 * | 12/2002 | Srinivasan et al. | | 716/4 |
| 6,934,921 B1 * | 8/2005 | Gu et al. | | 716/6 |
| 6,952,812 B2 * | 10/2005 | Abadir et al. | | 716/4 |
| 6,952,816 B2 * | 10/2005 | Gupta et al. | | 716/18 |
| 7,039,845 B2 * | 5/2006 | Rearick et al. | | 714/738 |
| 7,188,327 B2 * | 3/2007 | Hahn | | 716/6 |
| 2009/0119629 A1 * | 5/2009 | Grise et al. | | 716/6 |

* cited by examiner

*Primary Examiner* — Naum Levin

(57) ABSTRACT

A system for, and method of, reducing the generation of inconsequential violations resulting from timing analyses and an electronic design automation (EDA) tool incorporating the system or the method. In one embodiment, the system includes: (1) a timing violation identifier configured to identify at least some timing violations in a circuit based on a timing analysis, (2) an unsensitizable path identifier configured to identify at least some unsensitizable paths in the circuit and (3) a repair list generator coupled to the timing violation identifier and the unsensitizable path identifier and configured to generate a repair list based on both the at least some timing violations and the at least some unsensitizable paths.

20 Claims, 2 Drawing Sheets

US 7,971,169 B1

SYSTEM AND METHOD FOR REDUCING THE GENERATION OF INCONSEQUENTIAL VIOLATIONS RESULTING FROM TIMING ANALYSES

TECHNICAL FIELD

The invention is directed, in general, to timing analysis and, more specifically, to a system and method for reducing the generation of inconsequential timing violations resulting from timing analyses.

BACKGROUND

Electronic design automation (EDA) tools, a category of computer aided design (CAD) tools, are used by electronic circuit designers to create representations of circuit configurations, including representations of cells (e.g., transistors) and the interconnects they drive. EDA tools allow designers to construct a circuit and simulate its performance using a computer and without requiring the costly and lengthy process of fabrication. EDA tools are indispensable for designing modern, very-large-scale integrated circuits (VSLICs). For this reason, EDA tools are in wide use.

One type of EDA tool, an extraction tool, performs electric circuit extraction, or simply "extraction," which is a translation of an IC layout back into the electrical circuit ("netlist") it is intended to represent. Extracted circuits may be needed for various purposes, including circuit simulation and timing analysis, which includes static timing analysis (STA) and statistical timing analysis (SSTA). In extraction, an informal distinction is often made between designed devices, which are devices that are deliberately created by the designer, and parasitic devices, which were not explicitly intended by the designer but are inherent in the layout of the circuit. Accordingly, the typical extraction occurs in three phases: designed device extraction, interconnect extraction, and parasitic device extraction.

Timing signoff is a required step in the design flow that is time consuming, requires iterations of timing analysis to identify critical paths and repairing identified timing violations identified in those critical paths. Unfortunately, this approach has a serious drawback. Since timing analysis (performed with either an STA tool or an SSTA tool) is performed with no reference to the logical behavior of the circuit being analyzed, a significant portion (more than 60%) of the critical paths identified by timing analysis are unsensitizable, i.e., no transition ever propagates along them during normal circuit operation. In other words, more than 60% of the timing violations identified by timing analysis would result in a designer's time being wasted repairing violations that are of no consequence (not "real"). If the designer cannot repair a violation in a critical path, at least that portion of the circuit must be made to operate at a lower speed. If that critical path is unsensitizable, the circuit's performance has been compromised for no good reason. By virtue of having to repair unsensitizable paths, the time, called "tapeout," at which a circuit is declared ready ("signed off") for manufacture is delayed, and the performance of the circuit may be impaired.

SUMMARY

One aspect of the invention provides a system for reducing the generation of inconsequential (not real) violations resulting from timing analyses. In one embodiment, the system includes: (1) a timing violation identifier configured to identify at least some timing violations in a circuit based on a timing analysis, (2) an unsensitizable path identifier configured to identify at least some unsensitizable paths in the circuit and (3) a repair list generator coupled to the timing violation identifier and the unsensitizable path identifier and configured to generate a repair list based on both the at least some timing violations and the at least some unsensitizable paths.

Another aspect of the invention provides a method of reducing the generation of inconsequential (not real) violations resulting from timing analyses. In one embodiment, the method includes: (1) identifying at least some timing violations in a circuit based on a timing analysis, (2) identifying at least some unsensitizable paths in the circuit and (3) generating a repair list based on both the at least some timing violations and the at least some unsensitizable paths.

Yet another aspect of the invention provides an EDA tool. In one embodiment, the tool includes: (1) a parasitic parameter extraction tool configured to extract parasitic parameters associated with a circuit, (2) a timing analysis tool configured to perform a timing analysis based on the parasitic parameters, (3) a logic simulator tool configured to simulate logic in the circuit, (4) a sensitizable path identification tool configured to identify sensitizable paths based on the logic and (5) a system for reducing the generation of inconsequential violations resulting from timing analyses. In one embodiment, the system includes: (5a) a timing violation identifier configured to identify at least some timing violations in the circuit based on the timing analysis, (5b) an unsensitizable path identifier configured to identify at least some unsensitizable paths in the circuit based on the sensitizable paths and (5c) a repair list generator coupled to the timing violation identifier and the unsensitizable path identifier and configured to generate a repair list based on both the at least some timing violations and the at least some unsensitizable paths.

The foregoing has outlined certain aspects and embodiments of the invention so that those skilled in the pertinent art may better understand the detailed description of the invention that follows. Additional aspects and embodiments will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the invention, reference is now made to the following descriptions taken in conjunction with the accompanying drawings, in which.

DETAILED DESCRIPTION OF CERTAIN ASPECTS AND EMBODIMENTS

Described herein are various embodiments of systems, methods and EDA tools directed to reducing the generation of inconsequential (not real) violations resulting from timing analyses. Reducing the generation of inconsequential violations reduces the overall number of violations that need to be repaired. Thus, timing signoff and tapeout may occur sooner than heretofore possible. In various embodiments described herein, a commercial automatic test pattern generation (ATPG) tool may be used to generate patterns for path delay tests to find most unsensitizable paths.

A path is defined to be sensitizable if there exists an input vector such that all the side-inputs along the path are non-controlling values when the corresponding on-input propagates a non-controlling transition. Stated another way, a path is sensitizable if its side inputs can be set to values such that a transition applied to its input is able to propagate to its output. Accordingly, a path is unsensitizable if, irrespective of the values of the side inputs, a transition applied to the path's input cannot propagate to its output. Thus an apparent timing violation with respect to an unsensitizable path is not real, since a transition cannot ever traverse the entire path. Repairing that timing violation is of no consequence; the circuit will operate no more correctly than it did before the "repair." It only makes sense to repair real timing violations.

Unsensitizable paths can be marked as false paths and removed from the repair list. In some example circuits, removing timing violations attributable to unsensitizable paths from the list of timing violations to be repaired can amount to an 88% reduction in the repair list, which is substantial.

Figure 1:
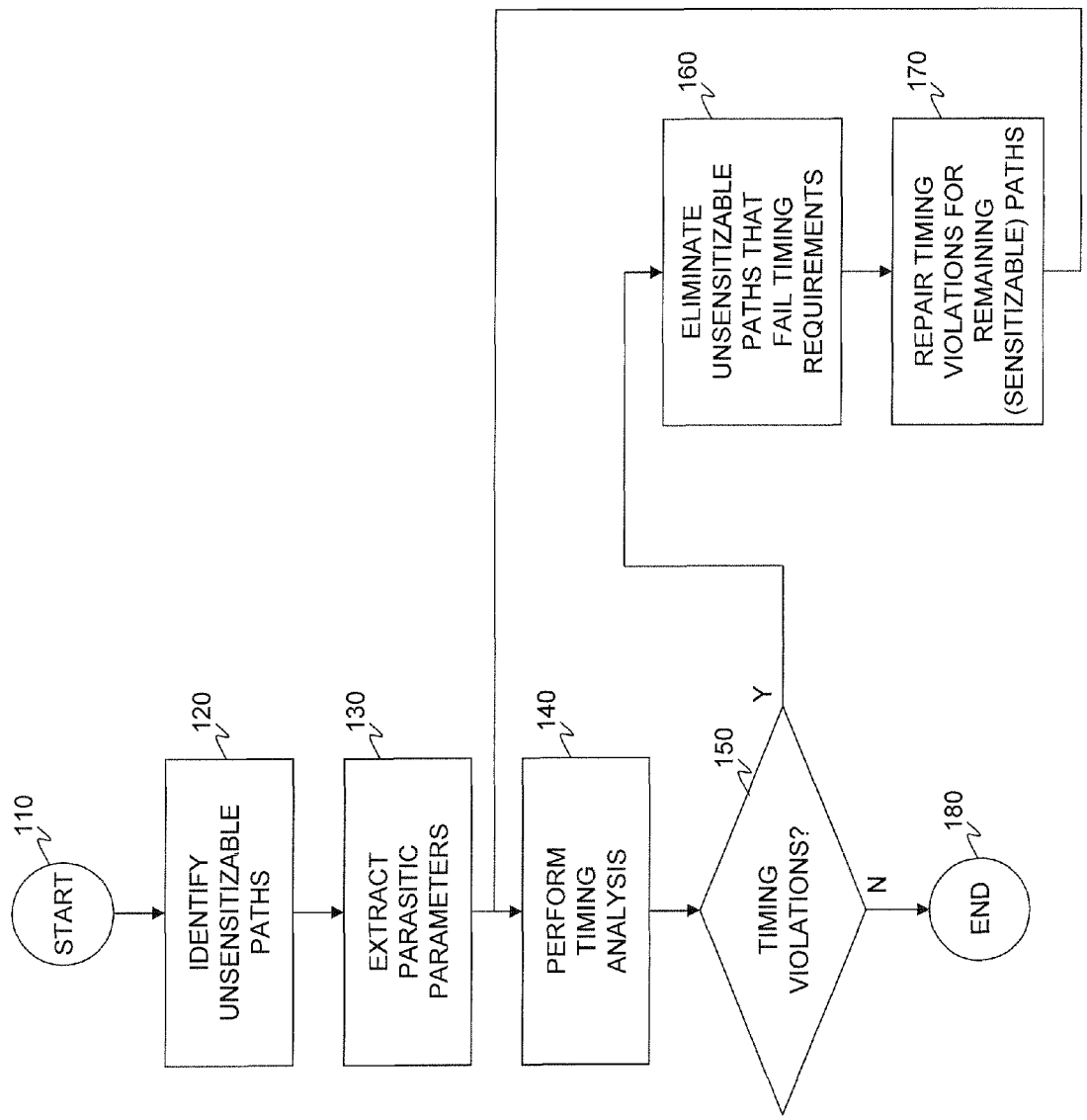
FIG. 1 is a flow diagram of one embodiment of a method of reducing the generation of inconsequential violations resulting from timing analyses carried out according to the principles of the invention.

FIG. 1 is a flow diagram of one embodiment of a method of reducing the generation of inconsequential violations resulting from timing analyses carried out according to the principles of the invention. The method starts in a start step 110 in which it is desired to pursue a timing signoff on a circuit. In a step 120, unsensitizable paths in the circuit are identified. The step 120 may be carried out by simulating the operation of logic in the circuit and identifying sensitizable paths based on the simulation. Unsensitizable paths in the circuit are therefore paths in the circuit other than the ones identified as sensitizable.

In a step 130, parasitic parameters are extracted from the circuit. In a step 140, a timing analysis is performed based on the parasitic parameters extracted in the step 130. The timing analysis may be an STA or an SSTA. In a decisional step 150, it is determined whether timing violations exist. If timing violations do exist, unsensitizable paths (identified in the step 120) that violate timing requirements are eliminated from consideration (disregarded as being inconsequential) in a step 160. Then, in a step 170, timing violations for the remaining (at least predominantly sensitizable) paths are repaired. The steps 140, 150, 160, 170 are repeated until no timing violations are determined to exist in the step 170. In an alternative embodiment, the timing analysis of the step 140 is not repeated after the remaining timing violations are first repaired in the step 170. Instead, only the steps 150, 160, 170 are repeated. The method then ends in a step 180.

Figure 2:
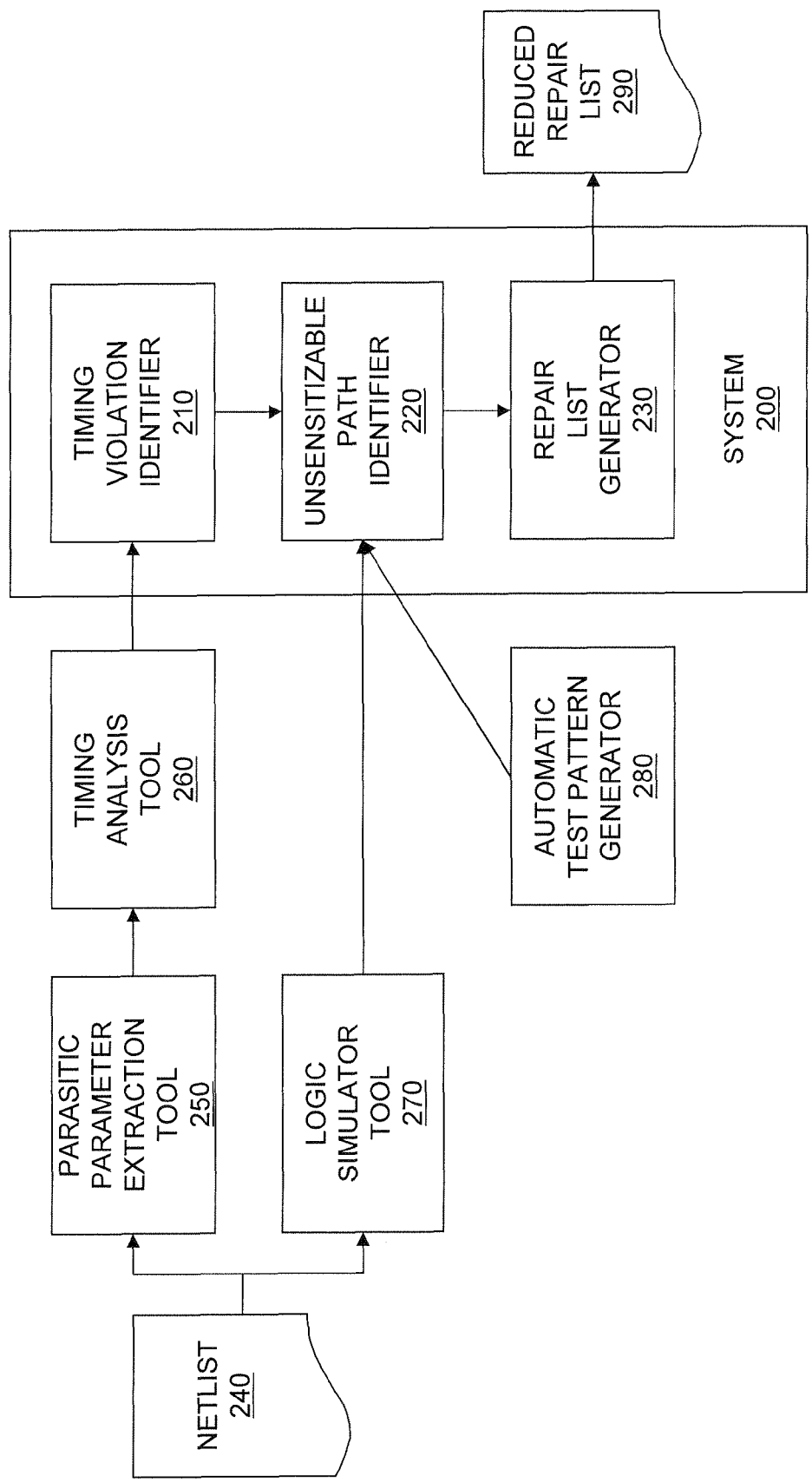
FIG. 2 is a block diagram of one embodiment of a system for reducing the generation of inconsequential violations resulting from timing analyses constructed according to the principles of the invention.

FIG. 2 is a block diagram of one embodiment of a system 200 for reducing the generation of inconsequential violations resulting from timing analyses constructed according to the principles of the invention. The system 200 includes a timing violation identifier 210, an unsensitizable path identifier 220 coupled to the timing violation identifier 210 and a repair list generator 230 coupled to the unsensitizable path identifier 220. The illustrated embodiment of the system 200 is configured to receive two inputs: the results of a timing analysis and a list of sensitizable paths. In the embodiment of FIG. 2, those inputs are supplied as follows.

A netlist 240 containing a list of all designed devices in a circuit and interconnects is made available to a parasitic parameter extraction tool 250. The parasitic parameter extraction tool 250 may be one commercially available from Synopsis, Inc., of Mountain View, Calif., or Cadence Design Systems of San Jose, Calif. The parasitic parameter extraction tool 250 extracts interconnect information from the netlist 240 and determines parameters associated with designed and parasitic devices in the circuit. Those parasitic parameters are provided to a timing analysis tool 260. The timing analysis tool 260 performs a timing analysis with respect to the circuit, determining signal propagation speeds through all of the paths in the circuit. The timing analysis tool 260 may be an STA tool or an SSTA tool commercially available from Synopsis, Inc., of Mountain View, Calif., or Cadence Design Systems of San Jose, Calif. However, being conventional, the timing analysis tool 260 performs its timing analysis without regard to the logic flow of the circuit. The results of the timing analysis are provided to the timing violation identifier 210, which is configured to employ the results of the timing analysis to produce a list of timing violations, namely paths in the circuit where the signal propagation speed is such that the circuit will perform improperly. If signal propagation speeds are slow, setup violations result; if signal propagation speeds are fast, hold violations result. In the illustrated embodiment, the timing violation identifier 210 produces a list of all timing violations in the circuit. In an alternative embodiment, the timing violation identifier 210 produces a list of at least some timing violations.

The netlist 240 is also made available to a logic simulator tool 270. The logic simulator tool 270 analyzes the circuit in terms of its logic flow, tracking logic states (zeroes and ones) as they propagate through the circuit. The logic simulator tool 270 may be an STA tool or an SSTA tool commercially available from Synopsis, Inc., of Mountain View, Calif., or Cadence Design Systems of San Jose, Calif. However, being conventional, the logic simulator tool 270 analyzes the logic flow of paths in the circuit without regard to signal propagation speed. The unsensitizable path identifier 220 receives the output of the logic simulator tool, which is a list of logic paths through the circuit. The unsensitizable path identifier 220 also receives the output of an ATPG 280. The ATPG 280 generates test patterns that the unsensitizable path identifier 220 applies to the side-inputs of the paths identified in the logic flow. In accordance with the definition of "sensitizable path" set forth above, paths in which input transitions can propagate to outputs given some test pattern are identified as sensitizable; by elimination, the remaining paths are identified as unsensitizable.

The timing violation identifier 210 and the unsensitizable path identifier 220 cooperate to produce a list of timing violations that involve only sensitizable paths. Stated another way, the unsensitizable path identifier 220 filters the output of the timing violation identifier 210 such that timing violations involving paths identified as unsensitizable (inconsequential violations) are removed from the list of timing violations. The resulting repair list 290, produced by the repair list generator 230, predominantly includes indications of timing violations that if repaired result in meaningful progress toward timing signoff and eventual tapeout. In an alternative embodiment, the repair list omits all timing violations pertaining to unsensitizable paths.

Certain embodiments of the invention further relate to computer storage products with a computer-readable medium that have program code thereon for performing various computer-implemented operations that embody the tools or carry out the steps of the methods set forth herein. The media and program code may be those specially designed and constructed for the purposes of the invention, or they may be of the kind well known and available to those having skill in the computer software arts. Examples of computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which the invention relates will appreciate that other and further additions, deletions, substitutions and modifications may be made to the described embodiments without departing from the scope of the invention.

What is claimed is:

1. A system for reducing the generation of inconsequential violations resulting from timing analyses, comprising:
   an unsensitizable path identifier configured to identify at least some unsensitizable paths in a circuit before other steps;
   a parasitic parameter extraction tool configured to extract parasitic parameters in said circuit in a second step;
   a timing violation identifier configured to identify at least some timing violations in said circuit based on a timing analysis in a third step, wherein said timing analysis uses said extracted parasitic parameters; and
   a repair list generator coupled to said timing violation identifier and said unsensitizable path identifier and configured to generate a repair list based on both said at least some timing violations and said at least some unsensitizable paths.

2. The system as recited in claim 1 wherein said timing analysis includes at least one selected from the group consisting of:
   a static timing analysis, and
   a statistical timing analysis.

3. The system as recited in claim 1 wherein said unsensitizable path identifier is configured to identify said unsensitizable paths based on sensitizable paths identified in said circuit.

4. The system as recited in claim 1 wherein said repair list contains a reduced number of timing violations attributable to unsensitizable paths in said circuit.

5. The system as recited in claim 1 wherein a netlist describing said circuit is employed as a common source of information for both said timing analysis and an identification of sensitizable paths in said circuit.

6. The system as recited in claim 1 wherein said timing analysis is based on extracted parasitic parameters and said at least some unsensitizable paths are based on output from a logic simulator tool.

7. The system as recited in claim 1 wherein said circuit is an integrated circuit.

8. The system as recited in claim 1 wherein said timing violation identifier, said an unsensitizable path identifier and said repair list generator are embodied in program code stored on a non-transitory computer-readable medium.

9. A method of reducing the generation of inconsequential violations resulting from timing analyses, comprising:
   identifying at least some unsensitizable paths in a circuit before other steps;
   extracting parasitic parameters from said circuit in a second step;
   identifying at least some timing violations in said circuit based on a timing analysis in a third step, wherein said timing analysis uses said extracted parasitic parameters; and
   generating a repair list based on both said at least some timing violations and said at least some unsensitizable paths, wherein said steps are performed by a processor.

10. The method as recited in claim 9 wherein said timing analysis is carried out by carrying out at least one selected from the group consisting of:
    a static timing analysis, and
    a statistical timing analysis.

11. The method as recited in claim 9 wherein said identifying said at least some unsensitizable paths comprises identifying said unsensitizable paths based on sensitizable paths identified in said circuit.

12. The method as recited in claim 9 wherein said repair list contains a reduced number of timing violations attributable to unsensitizable paths in said circuit.

13. The method as recited in claim 9 further comprising employing a netlist describing said circuit as a common source of information for both said timing analysis and an identification of sensitizable paths in said circuit.

14. The method as recited in claim 9 further comprising:
    basing said timing analysis on extracted parasitic parameters; and
    basing said at least some unsensitizable paths on output from a logic simulator tool.

15. The method as recited in claim 9 wherein said circuit is an integrated circuit.

16. An electronic design automation tool, comprising:
    a parasitic parameter extraction tool configured to extract parasitic parameters associated with a circuit;
    a timing analysis tool configured to perform a timing analysis based on said parasitic parameters;
    a logic simulator tool configured to simulate logic in said circuit;
    and
    a system for reducing the generation of inconsequential violations resulting from timing analyses, including:
      an unsensitizable path identifier configured to identify at least some unsensitizable paths in a circuit based on said sensitizable paths before other steps,
      a timing violation identifier configured to identify at least some timing violations in said circuit based on said timing analysis in a next step, wherein said timing analysis uses said extracted parasitic parameters, and
      a repair list generator coupled to said timing violation identifier and said unsensitizable path identifier and configured to generate a repair list based on both said at least some timing violations and said at least some unsensitizable paths.

17. The tool as recited in claim 16 wherein said timing analysis tool is selected from the group consisting of:
    a static timing analysis tool, and
    a statistical timing analysis tool.

18. The tool as recited in claim 16 wherein said repair list contains a reduced number of timing violations attributable to unsensitizable paths in said circuit.

19. The tool as recited in claim 16 wherein a netlist describing said circuit is employed as a common source of information for both said parasitic parameter extraction tool and said logic simulator tool.

20. The tool as recited in claim 16 wherein said circuit is an integrated circuit.

* * * * *